United States Patent
Triyoso et al.

(10) Patent No.: US 8,404,594 B2
(45) Date of Patent: Mar. 26, 2013

(54) REVERSE ALD

(75) Inventors: Dina H. Triyoso, Austin, TX (US); Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 899 days.

(21) Appl. No.: 11/139,765

(22) Filed: May 27, 2005

(65) Prior Publication Data

US 2006/0270239 A1   Nov. 30, 2006

(51) Int. Cl.
  *C23F 1/00* (2006.01)
  *H01L 21/461* (2006.01)
  *H01L 21/302* (2006.01)
  *B44C 1/22* (2006.01)

(52) U.S. Cl. ............. 438/706; 438/689; 216/62

(58) Field of Classification Search ........... 216/62, 216/58, 83; 438/734, 508, 585, 706, 689
See application file for complete search history.

(56) References Cited

U.S. PATENT DOCUMENTS

| | | | | |
|---|---|---|---|---|
| 4,756,794 A | * | 7/1988 | Yoder | .............. 216/62 |
| 6,667,246 B2 | | 12/2003 | Mitsuhashi et al. | |
| 6,897,095 B1 | | 5/2005 | Adetutu et al. | |
| 2003/0104706 A1 | * | 6/2003 | Mitsuhashi et al. | ......... 438/756 |
| 2004/0033699 A1 | | 2/2004 | Hector et al. | |
| 2004/0038538 A1 | * | 2/2004 | Ho et al. | ......... 438/694 |
| 2004/0043627 A1 | * | 3/2004 | Wieczorek et al. | ......... 438/758 |
| 2004/0110375 A1 | * | 6/2004 | Chen et al. | ......... 438/689 |
| 2004/0118805 A1 | * | 6/2004 | Hareland et al. | ......... 216/13 |
| 2004/0191974 A1 | | 9/2004 | Gilmer et al. | |
| 2004/0248348 A1 | * | 12/2004 | Rausch et al. | ......... 438/197 |
| 2005/0085092 A1 | | 4/2005 | Adetutu et al. | |
| 2005/0282341 A1 | * | 12/2005 | Park et al. | ......... 438/283 |
| 2006/0131652 A1 | * | 6/2006 | Li | ......... 257/350 |
| 2006/0162861 A1 | * | 7/2006 | O'Meara et al. | ......... 156/345.24 |

OTHER PUBLICATIONS

S. Wolf, Silicon Processing for the VLSI Era, vol. 4—Deep Submicron Process Technology, Lattice Press, 2002, pp. 12-13.*
S. Wolf and R.N. Tauber, (Silicon Processing for the VLSI Era, vol. 1—Process Technology, Lattice Press, 1986)(pp. 283-288).*
Stallcup II et al. (Journal of Vacuum Science and Technology. B 14(2), Mar./Apr. 1996, pp. 929-932) Used only as evidence.*
Encyclopedia of Physics, second edition, VCH Publishers, 1990, p. 29-30, used only as evidence.*
Gurbuz et al. (Diamond Semiconductor Technology for RF Device Applications, Elsevier, Solid-State Electronics 49 (2005) pp. 1055-1070) is used only as evidence.*

(Continued)

*Primary Examiner* — Duy Deo
*Assistant Examiner* — Mahmoud Dahimene
(74) *Attorney, Agent, or Firm* — Hamilton & Terrile, LLP; Michael Rocco Cannatti (57) ABSTRACT

A semiconductor process and apparatus includes forming first and second gate electrodes (151, 161) by forming the first gate electrode (151) over a first high-k gate dielectric (121) and forming the second gate electrode (161) over at least a second high-k gate dielectric (122) different from the first gate dielectric (121). Either or both of the high-k gate dielectric layers (121, 122) may be formed by depositing and selectively etching an initial layer of high-k dielectric material (e.g., 14). As deposited, the initial layer (14) has an exposed surface (18) and an initial predetermined crystalline structure. An exposed thin surface layer (20) of the initial layer (14) is prepared for etching by modifying the initial crystalline structure in the exposed thin surface layer. The modified crystalline structure in the exposed thin surface layer may be removed by applying a selective etch, such as HF or HCl.

17 Claims, 5 Drawing Sheets

OTHER PUBLICATIONS

A.E. Braun, "ALD Breaks Materials, Conformality Barriers," http://www.reed-electronics.com/semiconductor/index.asp?layout=articlePrint&articleID=CA164276.

G. Dan Hutcheson, "The First Nanochips," http://web.rollins.edu/~tlairson/tech/nanochips.html.

"Tutorial—Micro and Nanoelectronics," http://www.sigmaaldrich.com/Area_of_Interest/Chemistry/Materials_Science/Micro_and_Nanoelectronics/Tutorial.html.

V.Y. Thean et al., U.S. Appl. No. 10/924,632, filed Aug. 24, 2004, entitled "Semiconductor Transistor Having Structural Elements of Differing Materials and Method of Formulation".

A.E. Braun, "ALD Breaks Materials, Conformality Barriers," http://www.reed-electronics.com/semiconductor/index.asp?layout=articlePrint&articleID=CA164276, Oct. 1, 2001.

G. Dan Hutcheson, "The First Nanochips," http://web.rollins.edu/~tlairson/tech/nanochips.html, Apr. 2004.

"Tutorial—Micro and Nanoelectronics," http://www.sigmaaldrich.com/Area_of_Interest/Chemistry/Materials_Science/Micro_and_Nanoelectronics/Tutorial.html, 2005, printed Sep. 1, 2005.

* cited by examiner

REVERSE ALD

BACKGROUND OF THE INVENTION

1. Field of the Invention

The present invention is directed in general to the field of semiconductor devices. In one aspect, the present invention relates to an etch process for making integrated circuit devices.

2. Description of the Related Art

As the size and scaling of semiconductor device technology is reduced, the requirements for device design and fabrication—such as controlling the thickness of thinner gate dielectric and other constituent layers, better uniformity control and/or obtaining thinner film thicknesses—continue to tighten. In addition, leakage current due to underlying substrate damage created during fabrication is an additional problem with smaller devices. An additional challenge posed by decreasing feature sizes is that aspects of device design and fabrication that previously gave rise to only second-order effects in long-channel devices can no longer be ignored. For example, the reduced scaling of channel length and gate oxide thickness in a conventional MOS transistor exacerbates problems of polysilicon gate depletion, high gate resistance, high gate tunneling leakage current and dopant (i.e., boron) penetration into the channel region of the device. As a result, CMOS technology, which once relied on polysilicon as a gate conductor and silicon dioxide as a gate dielectric, now contemplates the use of dual-metal gate conductors and high dielectric constant (high-k) dielectrics. While high-k gate dielectric materials advantageously exhibit a relatively high dielectric constant (k) to enable the deposition of thicker gate dielectric layers without adversely affecting the physical and electrical thickness characteristics of the deposited dielectric layer (compared with thinner silicon dioxide dielectric layers), such high-k materials can be difficult to etch with conventional etchant techniques, making it difficult to control the layer thickness of such materials.

In addition to enhancements in the gate dielectric, substantial interest has been engendered in the use of metal layers with smaller semiconductor devices, such as metal gates used as an alternative to polysilicon or metal glue layers used with metal interconnects. For example, metal gates not only obviate gate-depletion and boron-penetration effects, but also provide a significantly lower sheet resistance. However, the use of high-k gate dielectric layers and metal gate devices creates new design challenges, such as pinning the work function of the gate electrodes toward the middle of the silicon band gap, which has a negative impact on device parameters including threshold voltage and drive current which can be different for NMOS and PMOS devices. This has led investigators into dual gate dielectric materials. Hence, CMOS processes may use a certain high-k material for the NMOS devices, while a different material might be used for the PMOS devices.

One typical manufacturing technique for advanced integrated circuits is the use of different dielectric thicknesses to optimize transistor performance for p-type or n-type transistors and for the various circuit elements such as logic and memory components on the same chip. With silicon dioxide as the dielectric, the different thickness can be selectivity grown and removed from various potions of the circuit; however, this is not possible with a deposited dielectric, especially for the more difficult to etch high-k metallic oxide dielectrics. In addition, as the dielectric thickness is further scaled down, the control needed is truly on the atomic level since dielectric thickness differences of 5-20 nm may be needed for the different transistors.

Accordingly, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

In one aspect, an atomic layer etch (ALE)—also known as a digital layer etch—is used to remove very thin layers of material in a controlled and precise manner, thereby allowing removal of a monolayer or even a sub-monolayer of materials, such as transition metal oxides used for gate dielectric layers. With the disclosed ALE process, precisely controlled removal of layers is obtained, and multi-level dielectric structures may be formed by forming a second, different deposited dielectric layer after partially etching the first deposited dielectric layer with the ALE process. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid obscuring the present invention. Such descriptions and representations are used by those skilled in the art to describe and convey the substance of their work to others skilled in the art.

The present invention includes a method of forming a semiconductor device layer having a precise and controlled thickness. Under the method, an initial layer of material (such as a transition metal oxide or a multi-metal oxide) is formed in, on or over a semiconductor structure substrate using any desired technique, such as chemical vapor deposition (CVD) techniques, physical vapor deposition (PVD) techniques, atomic layer deposition (ALD) techniques, plating techniques (electroplating or electro-less plating) or any other technique for depositing or growing material in a layer. A thin layer (e.g., a monolayer or sub-monolayer) at any exposed surface of the initial layer is then amorphized, modified or otherwise has its crystalline structure changed, such as by pulsing the layer with, or alternately exposing the layer to, an appropriate gas flow (e.g., heavy ions) with or without a plasma source or directional ion energy source. In a selected embodiment, the thin layer is modified by adding energy to the surface layer of the initial layer of material by flowing charged ions which adhere to the surface. After the gas is evacuated, purged with an inert gas, or otherwise removed, the exposed thin layer is then removed or cleared from the semiconductor structure by applying, pulsing or alternately exposing the modified layer to an etchant, such as HF or HCl. After the etchant is evacuated, purged with an inert gas or otherwise removed, the process may be repeated until the desired thickness is removed from the initial layer of material. Thus, extremely thin layers of material can be removed from a film layer by altering the crystalline structure or energy level of the surface of the film layer and then using an etchant to remove the portion of the film layer having an altered surface structure.

Various illustrative embodiments of the present invention will now be described in detail with reference to FIGS. 1-18. It is noted that, throughout this detailed description, certain layers of materials will be deposited and removed to form the semiconductor structure. Where the specific procedures for depositing such layers or thicknesses of such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Figure 1:
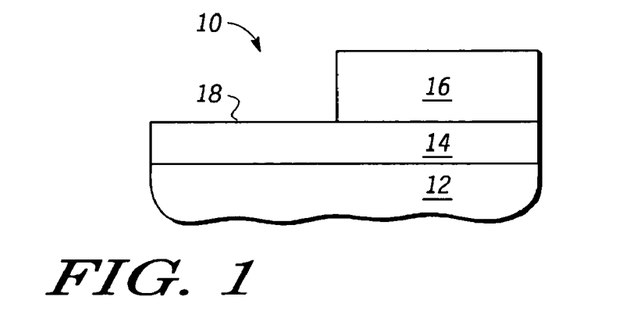
FIG. 1 is a cross-sectional view of a semiconductor structure in which a first layer is formed over an underlying layer.

FIG. 1 illustrates a cross-sectional view of a portion of an electronic component, such as a multi-layer semiconductor structure 10 during fabrication. The structure 10 includes an underlying layer 12 having at least a first layer 14 disposed thereon, and may also include a second layer 16 disposed over at least part of the first layer 14, thereby leaving an exposed top surface 18 of the first layer 14.

In an illustrative example, the underlying layer 12 may be a substrate for supporting the semiconductor structure, the first layer 14 may be a metal oxide (MeOx) gate dielectric layer and the second layer 16 may be a gate electrode structure that includes at least one or more metal layers. For example, the underlying layer 12 may be implemented as a bulk silicon substrate, single crystalline silicon (doped or undoped), SOI substrate, SiGe substrate, a substrate comprising Group III-IV compounds, or an integrated circuit layer used in a later stage of the fabrication. In various embodiments, the first layer 14 may be a high-k or medium-k dielectric material, such as a metal oxide (MeOx) gate dielectric layer—such as hafnium dioxide or any other materials that may substitute for gate dielectric applications, including, for example, oxides, silicates or aluminates of zirconium, aluminum, lanthanum, strontium, titanium and combinations thereof—that is typically heat treated during the formation process, thereby making the dielectric material polycrystalline, which makes it more difficult to etch. A top surface of first layer 14 is denoted by reference numeral 18. The first layer 14 can include one or more other materials as provided herein below. As suggested above, the second layer 16 may be used to implement a metal gate electrode in a CMOS transistor device by incorporating at least one or more metal layers in the second layer, though the second layer 16 may alternatively be any layer or structure that serves a masking function for the etch steps described below. When the first layer 14 is implemented as a metal oxide gate dielectric layer in a metal gate transistor device, the first layer 14 may be formed on the underlying layer 12 using any desired deposition or growth technique, to have an initial thickness on the order of approximately 3-20 nanometers or less. In some cases, the first layer may be on the order of hundreds of angstroms thick.

Figure 2:
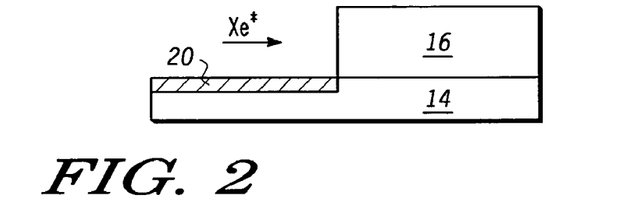
FIG. 2 illustrates processing subsequent to FIG. 1 in which an exposed surface of the first layer is modified.

FIG. 2 is a cross-sectional view of the semiconductor structure of FIG. 1 during further fabrication in which an exposed surface layer 20 of the first layer 14 is modified according to an illustrative embodiment of the present disclosure. Though not shown, an underlying layer 12 may still be present under the first layer 14. Selective modification of a surface region 20 of the first layer 14 may be obtained by flowing or pulsing appropriate ion species or gases (with or without plasma assist) to obtain a thin modified layer 20 in the first layer 14 such that its etch rate can be substantially increased when exposed to the selected reactant(s). The specific conditions for the ion pulse operation are selected to ensure that only a surface layer portion of the first layer 14 is modified in preparation for the subsequent etchant step. For example, when the first layer 14 is formed of polycrystalline hafnium oxide, the ions (such as Xe, Ar, He, Ge, Ga, N, O, etc.) may be pulsed with a plasma-assisted ion beam at 200 W and 300° C. to form a modified layer 20 having a thickness on the order of approximately 5-10 angstroms. As will be appreciated, the thickness of the surface region layer 20 will increase with increasing energy or temperature used in the ion pulse operations.

Figure 3:
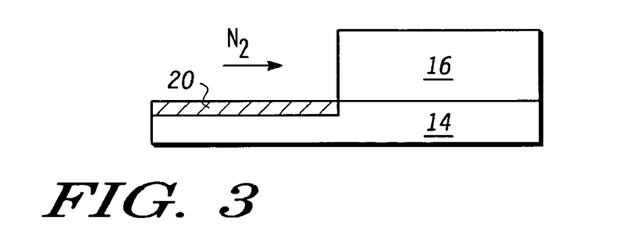
FIG. 3 illustrates processing subsequent to FIG. 2 in which the environment is purged with an inert gas.
Figure 4:
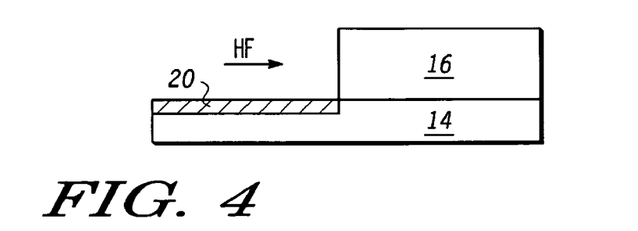
FIG. 4 illustrates processing subsequent to FIG. 3 in which the modified portion of the first layer is removed.
Figure 5:
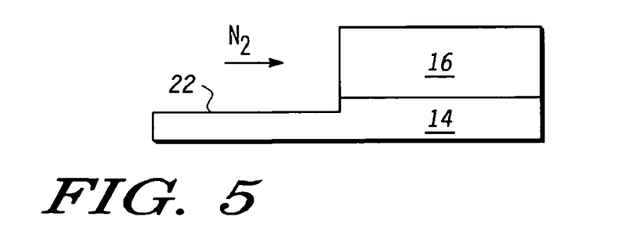
FIG. 5 illustrates processing subsequent to FIG. 4 in which the environment is purged with an inert gas.

FIGS. 3-5 illustrate cross-sectional views of the semiconductor structure after subsequent manufacturing steps. In FIG. 3, any remnant ions are removed from the environment in which the semiconductor structure 10 is fabricated, such as by evacuating and/or purging the environment with an inert gas, such as $N_2$ or Ar. In FIG. 4, an etchant gas or solvent is applied to the semiconductor structure 10, such as by flowing or pulsing a reactant species such as HF, HCl, etc. The etchant or solvent is chosen to selectively clear the thin-modified layer 20 from the semiconductor structure 10 so that the remaining portions of the semiconductor structure 10 (e.g., the remainder of the first layer 14 and the second layer 16) are not etched or are etched more slowly than the thin modified layer 20. The choice of etchants will depend on various factors, such as the composition of the various layers in the semiconductor structure, the composition of components or features present on the article at the time of etch, and the selectivity of a prospective etch. As illustrated in FIG. 5, once the thin modified layer 20 is removed and the etchant is purged with an inert gas (e.g., $N_2$ or Ar) or otherwise removed from the environment, the first layer 14 has a new exposed surface 22. Thus, the foregoing sequence of steps will remove a small amount of material 20 (e.g., a monolayer or sub-monolayer) from the first layer 14 in a controlled and precise manner with extreme precision, and can be repeated as necessary until the desired thickness of material is removed from the first layer 14.

Turning now to FIGS. 6-10, an alternative approach is illustrated for performing an atomic layer etch process to remove very thin layers of material in a controlled and precise manner, thereby allowing removal of a monolayer or even a sub-monolayer of materials, such as transition metal oxides, metal silicates or metal aluminates used for gate dielectric layers. Beginning with FIG. 6, there is illustrated a cross sectional view of a multi-layer semiconductor structure 30 shown at an intermediate step in the process flow. The structure 30 includes an underlying layer 32 (e.g., substrate 32) having at least a first layer 34 (e.g., metal oxide gate dielectric layer 34) disposed thereon, and may also include a second layer 36 (e.g., gate electrode structure 36) disposed over at least part of the first layer 34, thereby leaving an exposed top surface 38 of the first layer 34.

Figure 6:
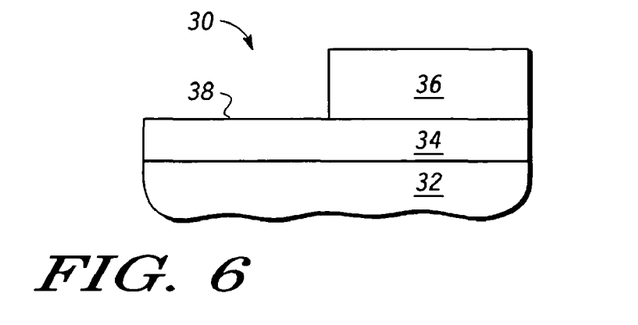
FIG. 6 is a partial cross-sectional view of a semiconductor structure in accordance with an alternative embodiment of the invention in which a first layer is formed over an underlying layer.
Figure 7:
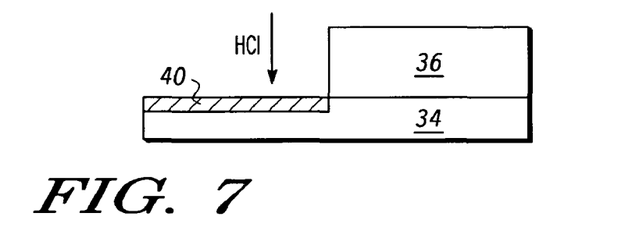
FIG. 7 illustrates processing subsequent to FIG. 6 in which a chemically reactive species is absorbed in an exposed surface of the first layer.
Figure 8:
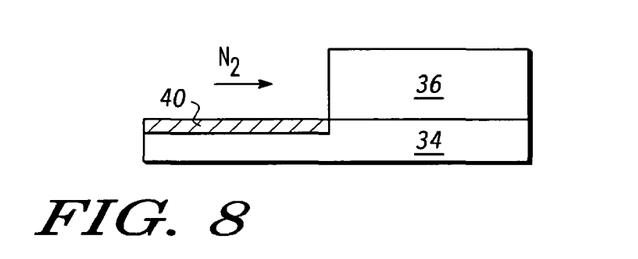
FIG. 8 illustrates processing subsequent to FIG. 7 in which the environment is purged with an inert gas.
Figure 9:
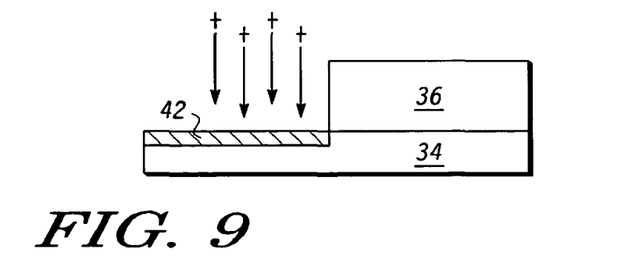
FIG. 9 illustrates processing subsequent to FIG. 8 in which energy is provided to etch a partial layer in the exposed surface of the first layer by reacting the absorbed species in the exposed surface of the first layer.
Figure 10:
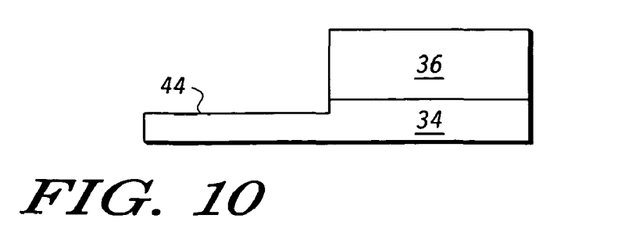
FIG. 10 illustrates processing subsequent to FIG. 9 in which the partial layer in the exposed surface of the first layer is removed.

FIG. 7 is a cross-sectional view of the semiconductor structure of FIG. 6 during further fabrication in which an exposed surface layer 40 of the first layer 34 chemically absorbs a reactive species according to an illustrative embodiment of the present disclosure. Selective absorption at a surface region 40 of the first layer 34 may be obtained by flowing or pulsing reactive species (such as HCl) which are absorbed by a thin surface layer 40 in the first layer 34. Next, and as illustrated in FIG. 8, any remnant reactive species are removed from the environment in which the semiconductor structure 30 is fabricated, such as by evacuating and/or purging the environment with an inert gas, such as $N_2$ or Ar. Energy (e.g., thermal energy) is then applied to the thin surface layer 40 to react the absorbed species, thereby etching the thin surface layer 42, as illustrated in FIG. 9. For example, a high-k dielectric first layer 34 may be etched by pulsing ions or neutrals (such as $Xe^+$, $Ar^+$, $He^+$, Xe, Ar, He, etc.) or applying an electron beam to remove a thin surface layer 42 having a thickness on the order of approximately 5-10 angstroms, depending on what material is used to form first layer 34. The etch rate for an annealed hafnium oxide film can be three times higher after an Ar implantation step. If desired, an etchant or solvent may be applied to the semiconductor structure 30, such as by flowing or pulsing an aqueous solution of HF or HCl. The etchant or solvent is chosen to selectively clear the thin surface layer 42 from the semiconductor structure 30 so that the remaining portions of the semiconductor structure 30 are not etched or are etched more slowly than the thin surface layer 42. As illustrated in FIG. 10, once the thin surface layer 42 is removed, the first layer 34 has a new exposed surface 44. Thus, the foregoing sequence of steps will remove a small amount of material 42 (e.g., a monolayer or sub-monolayer) from the first layer 44 in a controlled and precise manner with extreme precision, and can be repeated as necessary until the desired thickness of material is removed from the first layer 34.

Figure 11:
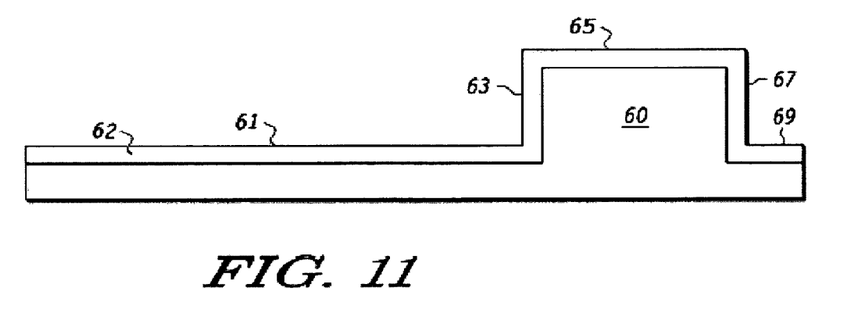
FIG. 11 is a partial cross-sectional view of a semiconductor structure in accordance with yet another alternative embodiment of the invention in which a first layer is formed over an underlying structure.
Figure 12:
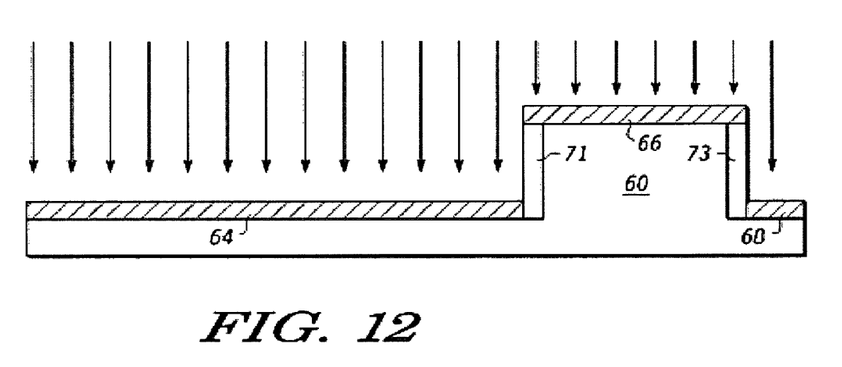
FIG. 12 illustrates processing subsequent to FIG. 11 in which selected portions of an exposed surface of the first layer are modified using a directional energy source.
Figure 13:
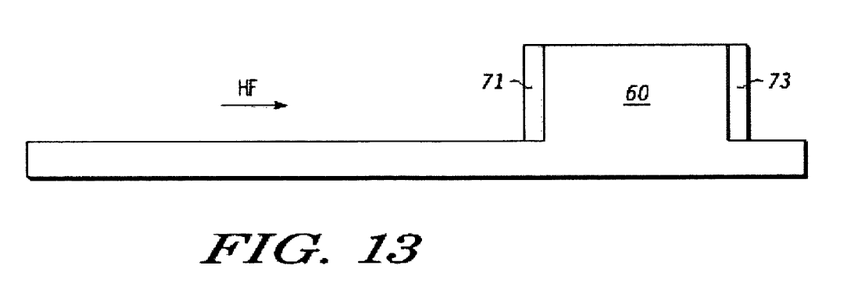
FIG. 13 illustrates processing subsequent to FIG. 12 in which the modified portions of the first layer are anisotropically etched.

Referring to FIGS. 11-13, there is depicted yet another alternative embodiment of the present invention whereby an atomic layer etch process is used to anisotropically remove very thin layers of material in a controlled and precise manner, thereby allowing removal of a monolayer or even a sub-monolayer of materials, such as transition metal oxides used for gate dielectric layers. Beginning with FIG. 11, there is illustrated a cross-sectional view of a contoured semiconductor structure 60 shown at an intermediate step in the process flow. The structure 60 may be formed of or on an underlying substrate layer (not shown). For example, the profile of the contoured structure may illustrate a single underlying layer (such as a substrate having a trench opening formed therein) or may illustrate the upper surface of a multi-layer structure (such as a gate electrode formed over a substrate and/or gate dielectric). A first layer 62 is disposed over at least part of the contoured semiconductor structure 60 so that the first layer 62 includes exposed horizontal surfaces 61, 65, 69 and exposed essentially vertical surfaces 63, 67. When the first layer 62 is formed of a heat treated high-k dielectric material, transition metal oxide or metal glue layer or layers, the layer 62 can be difficult to etch in a controlled and precise way with conventional etch processes. The present invention provides a way to prepare a selected surface layer portion of such a first layer for removal using conventional etch processes.

In particular, FIG. 12 shows a cross-sectional view of the semiconductor structure of FIG. 11 during further fabrication in which selected portions of an exposed surface of the first layer 62 are modified. In particular, by using a directional ion or e-beam energy source to introduce heavy ions through the horizontal surfaces 61, 65, 69, the crystalline structure of the thin substantially horizontal surface layers 64, 66, 68 is altered, as compared to the unaltered substantially vertical surface layers 71, 73. Because the altered thin horizontal surface layers 64, 66, 68 have a higher absorption and/or higher etch rate than those vertical surface layers 71, 73, the thin horizontal surface layers 64, 66, 68 will be cleared when an etchant or solvent is applied, such as by flowing or pulsing HF or HCl. As illustrated in FIG. 13, once the thin horizontal surface layers 64, 66, 68 are removed, only the vertical surface layers 71, 72 from the first layer 72 remain. As will be appreciated, the foregoing sequence of steps will anisotropically remove a small amount of material (e.g., a monolayer or sub-monolayer) from the horizontal surfaces of the first layer 62 in a controlled and precise manner with extreme precision, and can be repeated as necessary until the desired thickness of material is removed from the first layer 62.

It will be appreciated that, as device scaling continues to shrink, the required film thickness of various layers is also shrinking. The present invention provides the ability to remove a small amount of material in a controlled and precise manner. This is achieved by preparing a controlled amount of surface layer material for removal by altering its crystalline or chemical structure, and then applying an etchant that selectively removes the prepared surface layer material one layer at a time. The present invention has many possible applications on either the front end or back end of wafer processing operations, including clearing polycrystalline hafnium oxide from the exposed wafer surface (e.g., over the source/drain regions), as described hereinbelow. Another application is the formation of selective epitaxial Si and SiGe raised source/drain (S/D) regions and S/D extensions, which may be formed by alternately depositing and growing the epitaxial Si/SiGe using ALD techniques, and then using an atomic layer etch process of the present invention to remove Si or SiGe nucleation sites from selected areas (such as the spacer and isolation regions). In addition, the present invention may be applied to reverse the atomic layer deposition process one layer at a time, thereby providing a reverse atomic layer removal process. In addition to being applied as an isotropic removal process, the present invention may also be used to anisotropically remove surface layer material, and therefore has potential application in the planarization of thin films or the anisotropic removal of metal layers. For example by preparing a contoured thin film using a directional ion beam source (e.g., by pulsing heavy ions at an implant angle), only selected exposed thin surface layers on predetermined surfaces of the initial layer are modified (e.g., only selected portions of the contoured thin film receiving the implanted ions) may be removed with the subsequent etch step.

An illustrative application of the various embodiments of the present invention is illustrated in FIGS. 14-18, which show how an atomic layer etch process may be used to form an integrated circuit device by removing very thin layers (e.g., a monolayer or even a sub-monolayer) of a transition metal oxide gate dielectric layer in a controlled and precise manner. The illustrated device is a dual gate integrated circuit device formed with a CMOS fabrication process, where at least one gate electrode is formed over dual gate dielectric layers, either or both of which are formed with an atomic layer etch process.

Figure 14:
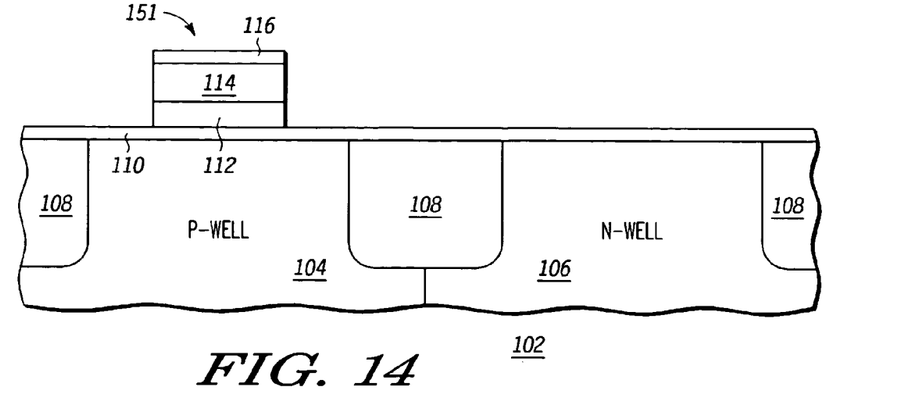
FIG. 14 is a partial cross-sectional view of a semiconductor wafer in accordance with another alternative embodiment of the invention in which a first gate electrode is formed over a first gate dielectric layer on a first portion of the wafer.

Referring now to FIG. 14, a cross-sectional view of a semiconductor wafer 102 is shown at an intermediate step in the process flow. As depicted, wafer 102 includes a first well region 104 (also referred to as first well 104) and a second well region 106 (second well 106) that are laterally displaced with respect to one another. The first well 104 and second well 106 contain impurities of opposing polarities such that one of the wells is a p-doped well and one of the wells is an n-doped well. In the described embodiment, the first well 104 is a p-doped well (p-well) in which NMOS transistors are formed, and the second well 106 is an n-doped well (n-well) in which PMOS transistors are formed.

Isolation regions 108 (e.g., field oxide or isolation dielectric trenches 108) have been fabricated within wafer 102. As the name implies, isolation regions 108 serve to provide electrical and physical isolation between adjacent devices (transistors). Isolation regions 108 are preferably comprised of a silicon-oxide (or other dielectric) compound formed by etching trenches into wafer 102, filling the trenches with a deposited dielectric, and polishing or etching the wafer to remove the excess dielectric. Alternatively, isolation dielectric trenches may be formed using conventional LOCOS processing in which silicon nitride is deposited and patterned to define the isolation regions and, thereafter, the exposed silicon of wafer 102 is thermally oxidized to form the isolation dielectric. In an SOI substrate, the isolation region may be replaced with a shallow trench isolation region.

Following the formation of wells 104 and 106 and isolation trenches 108, a first gate dielectric layer 110 is blanket deposited across the entire wafer 102. The first dielectric layer may be used to form at least part of the gate dielectric for all transistors on the wafer, or alternatively, the first dielectric layer may be used for only a first type of transistor formed on the wafer. In the depicted embodiment, the first dielectric layer 110 will serve as at least part of the gate dielectric for all transistors formed on the wafer 102. In an embodiment in which first well 104 is a p-well and the second well 106 is an n-well, at least part of the first gate dielectric layer 110 is used as at least part of the gate dielectric in the NMOS and PMOS transistors. In one such implementation, first dielectric layer 110 is a metal-oxide compound formed by chemical vapor deposition or by atomic layer deposition having a typical final thickness is in the range of 0.1-10 nanometers. A suitable metal oxide compound for use as first dielectric layer 110 is hafnium oxide (preferably $HfO_2$), though other oxides, silicates or aluminates of zirconium, aluminum, lanthanum, strontium, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties.

After forming the first dielectric layer 110, a first gate electrode 151 is formed above first well region 104 using a conventional gate electrode formation sequence. For example, the gate electrode 151 may be formed from a single conductive layer or by sequentially depositing or forming a gate electrode layer 112, a conductive layer 114, and an anti-reflective coating (ARC) 116 over the first dielectric layer 110 to form a first gate stack. In one embodiment, gate electrode layer 112 is a TaSiN layer having a thickness in the range of 1-20 nanometers. In another embodiment, gate electrode layer 112 is a TaC layer having a thickness in the range of 1-20 nanometers. The conductive layer 114 is an optional layer that may be used, for example, to simplify integration issues. Conductive layer 114 may be a heavily doped polysilicon, tungsten, or another suitable electrically conductive material having a thickness in the range of approximately 10-100 nanometers. Layer 116 may be another metal or may be a conducting or non-conducting layer. Once the first gate stack is formed, conventional gate electrode etch processing steps may be used to form the desired gate electrode 151.

Figure 15:
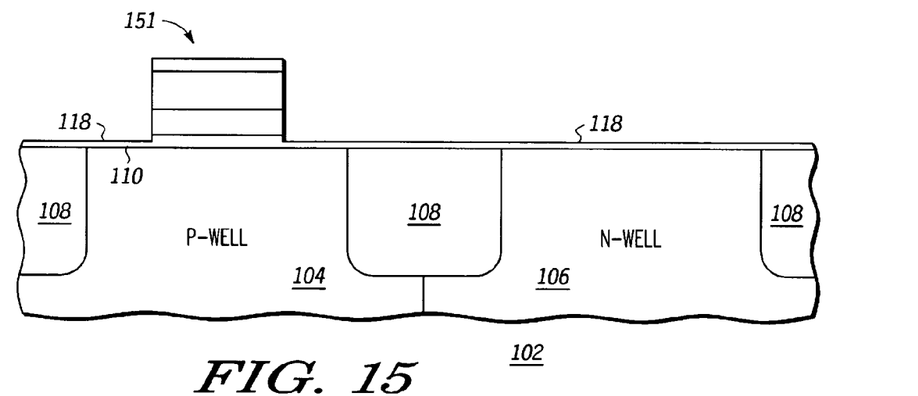
FIG. 15 illustrates processing subsequent to FIG. 14 in which an exposed portion of the first gate dielectric layer is removed.

Turning now to FIG. 15, following formation of the first gate electrode 151, all or part of the exposed portions of first gate dielectric layer 110 may optionally be removed by using an atomic layer etch process such as described herein. For example, approximately 0.1-20 angstroms or a partial atomic layer of the first gate dielectric layer 110 may be removed per etch cycle by pulsing the wafer 102 with a heavy ion flow and then applying an etchant to remove the modified portion of the first gate dielectric layer 110, thereby leaving a new exposed surface 118 on the first gate dielectric layer 110. More preferably, 5-8 angstroms of the layer 110 are removed per etch cycle. The ion flow conditions (e.g., implant or flow energy, temperature, plasma-type) are selected to ensure that only a surface layer portion of the first gate dielectric layer 110 is modified in preparation for the subsequent etchant step. In accordance with an illustrative example, the following implant conditions are used: 20-100 eV, 25 C-300 C, 10-300 watts. Alternatively, all exposed parts of the first gate dielectric layer 110 may be removed using an atomic layer etch process to effectively clear all of the first gate dielectric layer 110 from the wafer surface except under the first gate electrode, thereby preparing the wafer for additional processing steps without over-etching or otherwise damaging the substrate surface.

Figure 16:
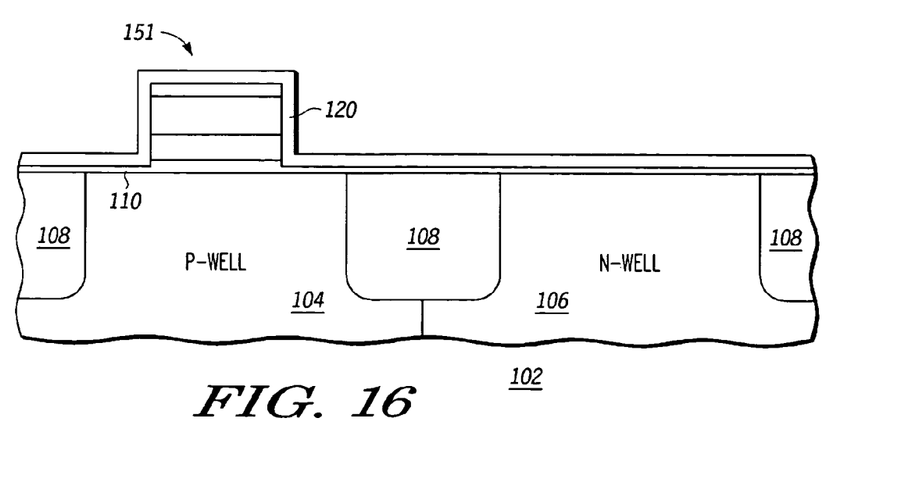
FIG. 16 illustrates processing subsequent to FIG. 15 in which a second gate dielectric layer is formed over at least the second portion of the wafer.

Turning to FIG. 16, a second gate dielectric layer 120 is formed non-selectively over wafer 102, such as by using conventional chemical vapor deposition, oxide growth or atomic layer deposition techniques. The second gate dielectric layer 120 may be a different material than first gate dielectric 110, and the thickness of the second gate dielectric 120 over second well region 106 may be different than the thickness of first gate dielectric 110 over first well region 104. In one embodiment of the invention, either or both of the first gate dielectric layer 110 and the second gate dielectric layer 120 are high-k dielectrics. As will be appreciated, a high-k dielectric is a dielectric having a dielectric constant that is at least 1.5 times the dielectric constant of $SiO_2$. In an embodiment suitable for its use in conjunction with PMOS transistors (such as those formed with MoON, MON, $IrO_x$, $ReO_x$, $RuO_x$, Ti, Ta, TiN, $W_2N$, etc.) having a gate electrode, the second gate dielectric 120 serves as a gate dielectric cap layer for the PMOS transistor devices, and may be implemented as an ALD dielectric film (e.g., $Al_2O_3$) having a thickness in the range of 0.5-10 nanometers. Although the second gate dielectric layer 120 is depicted in FIG. 16 as being formed on the remaining, unetched portion of the first gate dielectric 110 over the second well region 106, it will be appreciated that the second gate dielectric layer 120 may also be formed on the substrate surface when the first gate dielectric layer 110 has been cleared entirely from the exposed portions of the wafer surface.

Figure 17:
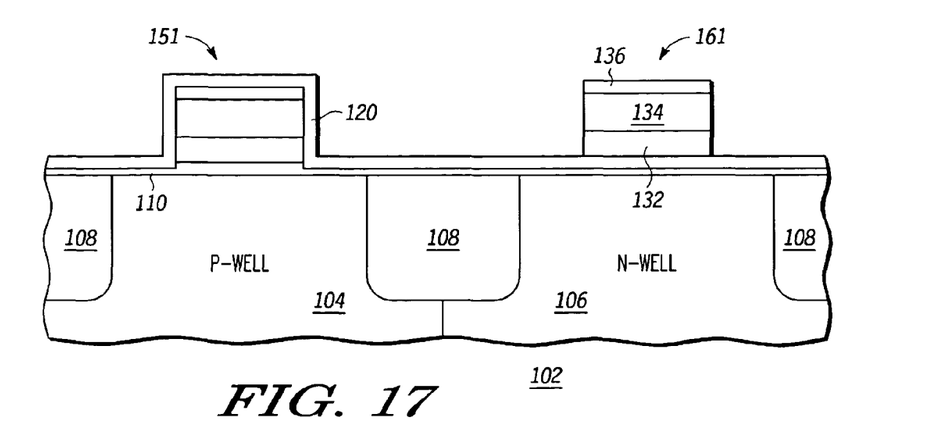
FIG. 17 illustrates processing subsequent to FIG. 16 in which a second gate electrode is formed over at least the second portion of the wafer.

In FIG. 17, a second gate electrode 161 is formed above second well region 106 using a conventional gate electrode formation sequence. When the second gate electrode 161 is formed separately from the first gate electrode using a single conductive layer or a sequence of layers 132, 134, 136 formed over the second well region, the composition and thickness of the second gate electrode 161 may be equivalent to or different from the composition and thickness of the first gate electrode 151. Whatever the composition and thickness of the first and second gate electrodes, the present invention may be used to form gate dielectric layers under the first and second gate electrodes that have an equivalent or different electrical thicknesses.

Figure 18:
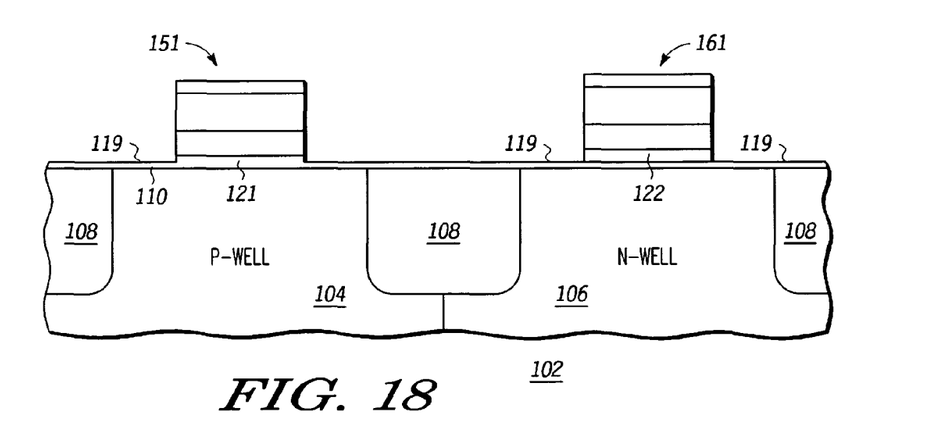
FIG. 18 illustrates processing subsequent to FIG. 17 in which an exposed portion of the second gate dielectric layer is removed.

Referring to FIG. 18, an atomic layer etch process may be used to remove a thin layer (e.g., a monolayer or sub-monolayer) at any exposed surface of the second gate dielectric layer 120. For example, by pulsing the exposed surface layer of the second gate dielectric layer 120 with heavy ion gas flow with or without a plasma source or directional ion energy source, a thin surface layer is modified or otherwise has its crystalline structure changed. Again, the ion type and implant conditions are selected to ensure that only a surface layer portion of the second gate dielectric layer 120 is modified or otherwise modified in preparation for the subsequent etchant step. After purging or removing the heavy ion gas, the exposed thin surface layer is then cleared from the wafer 102 by applying or pulsing an etchant, such as HF or HCl. After the etchant is evacuated, purged with an inert gas or otherwise removed, the process may be repeated until the desired thickness is removed from the second gate dielectric layer 120, thereby removing all or part of the second gate dielectric layer 120 from the surface of the wafer (including the first gate electrode 151) and leaving a new exposed surface 119 on the first gate dielectric layer 110. With the approach, the present invention provides a controlled technique for removing hard-to-etch materials with a self-limiting etch process by using HCl or HF pulses that remove the prepared surface layer material, but do not over etch and damage the underlying layers. At the conclusion of the etching process, a remnant portion 122 of the second gate dielectric layer 120 under the second gate electrode 161 remains to form all or part of the gate dielectric for the second gate electrode 161, while the remnant portion 121 of the first gate dielectric for the first gate electrode 151 is formed entirely from the first gate dielectric layer 110.

As explained herein, a selected embodiment of the invention may be used to form a gate electrode having a gate dielectric formed with one or more gate dielectric layers. In one variation, a two-layered gate dielectric is formed over both the first and second wells. In another variation, both well regions may have single-layered dielectrics formed from the same material, but with different thicknesses, by forming the first gate electrodes over an underlying gate dielectric layer having a first thickness, and then etching the exposed gate dielectric layer to a second thickness before forming the second gate electrodes over the thinner gate dielectric layer. Alternatively, both well regions may have single-layered dielectrics, but with different compositions. In yet another variation, the gate dielectric over one of the wells is a single-layered dielectric while the gate dielectric over the second well is a two-layered dielectric. For example, a first dielectric layer having a first composition, preferably 5 to 100 angstroms thick, could be the same on both the NMOS and PMOS sides. A second dielectric layer having a second composition, preferably 5 to 20 angstroms thick, may overlay only the second well to produce different gate electrode workfunctions. This second layer is essentially a work-function setting dielectric layer for the PMOS side. Of course, the double gate dielectric could be on the NMOS side, while the single gate dielectric is on the PMOS side. As will be appreciated, the precise layer control provided by the present invention may be used to form a gate electrode having a gate dielectric formed with three or more gate dielectric layers.

Those skilled in semiconductor fabrication will appreciate that additional, conventional processing steps (not depicted) are performed to complete the fabrication of first and second gate electrodes into transistors. As examples, one or more extension implant, halo implant, spacer formation, and source/drain implant steps may be performed to complete the transistors. In addition, conventional backend processing (not depicted) typically including multiple levels of interconnect is then required to connect the transistors in a desired manner to achieve the desired functionality.

In one form, there is provided herein a method for fabricating a relatively higher-k dielectric layer by forming a dielectric layer over an integrated circuit, modifying an exposed thin surface layer of the dielectric layer by applying energized ions and removing the exposed thin surface layer from the dielectric layer. The exposed thin surface layer may be modified by performing plasma processing of heavy ions at an exposed surface of the dielectric layer, by pulsing the exposed surface of the dielectric layer with a chemically reactive species that absorbs into the exposed thin surface layer or other suitable structural modification processes. The modified exposed thin surface layer may then be removed, such as by applying an etchant or by reacting the absorbed species, so that only a monolayer or sub-monolayer is removed, and the process is repeated until a desired thickness of the dielectric layer remains over the integrated circuit.

In another form, an integrated circuit structure and fabrication method is provided for forming a first transistor over a first well region that includes a first gate electrode overlying a first high-k gate dielectric layer. In addition, a second transistor is formed overlying a second well region that includes a second gate electrode overlying a second high-k gate dielectric layer. The first and second high-k gate dielectric layers may be formed with different material compositions (e.g., hafnium oxide and aluminum oxide), and the formation of either or both of the first and second high-k gate dielectric layers may include using an atomic layer etch process to control the final thicknesses of the first and second high-k gate dielectric layers. For example, the first high-k gate dielectric layer may be removed after the first gate electrode is formed by pulsing an exposed portion of the first high-k gate dielectric layer with ions and by subsequently pulsing the exposed portion of the first high-k gate dielectric layer with an etchant. In addition, the second high-k gate dielectric layer may be formed over the first high-k gate dielectric layer by pulsing an exposed portion of the second high-k gate dielectric layer with ions and subsequently pulsing the exposed portion of the second high-k gate dielectric layer with an etchant to remove the exposed thin surface layer of the second high-k gate dielectric layer after the second gate electrode is formed.

In another form, a method for fabricating a dielectric layer is provided whereby a first relatively higher-k dielectric layer having an exposed surface is formed over an integrated circuit. An exposed thin surface layer of the first dielectric layer is then modified by applying energized ions or electrons, such as by performing plasma processing of heavy ions at the exposed surface of the first dielectric layer to modify the crystalline structure of the exposed thin surface layer. Alternatively, the exposed thin surface layer is modified by pulsing the exposed surface of the first dielectric layer with a chemically reactive species for absorption into the exposed thin surface. The exposed thin surface layer is then removed from the first dielectric layer, such as by applying energy to react the absorbed species in the exposed thin surface layer and remove the exposed thin surface layer from the first dielectric layer. In this way, the modifying and removing steps may be repeated to remove material from the first dielectric layer, layer by layer, until a desired thickness of the first dielectric layer remains over the integrated circuit.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, an alternative to the device structure shown in FIG. 14 is for first well 104 to be an n-doped well and the second well 106 to be p-doped. Also the first and second gate electrode layers (112, 132) and the first and second conductive layers (114, 134) may be different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process, comprising:
    forming a high-k gate dielectric layer with a material selected from the group consisting of oxides, silicates or aluminates of hafnium, zirconium, aluminum, lanthanum, strontium, titanium, or any combination thereof, said gate dielectric layer having an exposed surface and an initial crystalline structure;
    preparing an exposed thin surface layer of the gate dielectric layer having a thickness of approximately 5-10 Angstroms for etching by modifying the initial crystalline structure in the exposed thin surface layer; and
    etching the exposed thin surface layer by pulsing an etchant to remove the thin surface layer from the gate dielectric layer.

2. The process of claim 1, wherein the preparing and etching steps are repeated until a desired amount of the gate dielectric layer having a predetermined thickness is removed.

3. The process of claim 1, wherein preparing an exposed thin surface layer comprises pulsing the initial layer with ions so that only the exposed thin surface layer is amorphized.

4. The process of claim 3, further comprising removing the ions prior to the etching step by introducing an inert gas.

5. The process of claim 1, wherein etching the exposed thin surface layer comprises pulsing the exposed thin surface layer with HF to remove the exposed thin surface layer from the gate dielectric layer.

6. The process of claim 1, further comprising removing the etchant by introducing an inert gas.

7. The process of claim 1, wherein preparing an exposed thin surface layer comprises using a directional ion beam source to pulse the gate dielectric layer with heavy ions so that only the exposed thin surface layer on a predetermined surface of the gate dielectric layer is amorphized.

8. The process of claim 1, wherein preparing an exposed thin surface layer comprises flowing a reactive species over the gate dielectric layer so that the reactive species are chemically absorbed in only the exposed thin surface layer.

9. The process of claim 8, wherein etching the exposed thin surface layer comprises pulsing the exposed thin surface layer with high energy ion beams to remove the exposed thin surface layer from the gate dielectric layer.

10. A method of making an integrated circuit structure, comprising:
    providing a substrate comprising a first well region and a second well region; and
    forming transistors over the first and second well regions so that a first plurality of the transistors, each comprising a first gate electrode overlying a first high-k gate dielectric layer, is formed over the first well region, and so that a second plurality of the transistors, each comprising a second gate electrode overlying a second high-k gate dielectric layer, is formed over the second well region, wherein the first and second high-k gate dielectric layers differ in composition and further wherein an atomic layer etch process is performed on either or both of the first and second high-k gate dielectric layers, wherein the atomic layer etch process comprises removing a thin surface layer having a thickness of approximately 5-8 Angstroms of either or both of the first and second high-k gate dielectric layers by pulsing an exposed portion of either or both of the first and second high-k gate dielectric layers with ions to modify an initial crystalline structure of the thin surface layer and by subsequently pulsing the exposed portion of either or both of the first and second high-k gate dielectric layers with an etchant.

11. The method of claim 10, wherein the first high-k gate dielectric layer comprises hafnium oxide and the second high-k gate dielectric layer comprises aluminum oxide.

12. The method of claim 10, wherein forming transistors comprises:
    forming the first high-k gate dielectric layer over the substrate; and
    forming the first gate electrodes over the first high-k gate dielectric layer,
    wherein the atomic layer etch process comprises removing a thin surface layer of the first high-k gate dielectric layer after the first gate electrode is formed by pulsing an exposed portion of the first high-k gate dielectric layer with ions and by subsequently pulsing the exposed portion of the first high-k gate dielectric layer with an etchant.

13. The method of claim 10, wherein forming transistors comprises:
    forming the first high-k gate dielectric layer over the substrate;
    forming the first gate electrodes over the first high-k gate dielectric layer;
    forming the second high-k gate dielectric layer over the first gate electrodes and the first high-k gate dielectric layer;
    forming the second gate electrodes over at least part of the second high-k gate dielectric layer; and
    removing at least an exposed thin surface layer of the second high-k gate dielectric layer by pulsing an exposed portion of the second high-k gate dielectric layer with ions and by subsequently pulsing the exposed portion of the second high-k gate dielectric layer with an etchant.

14. A method for fabricating a gate dielectric layer comprising:
    forming a high-k gate dielectric layer of hafnium oxide, said high-k gate dielectric layer having an exposed surface;
    preparing an exposed thin surface layer of the high-k gate dielectric layer having a thickness of approximately 5-10 Angstroms for removal by pulsing the exposed surface of the high-k gate dielectric layer with a chemically reactive species for absorption into the exposed thin surface layer; and
    removing the exposed thin surface layer from the high-k gate dielectric layer.

15. The method of claim 14, wherein the preparing step comprises pulsing the exposed thin surface layer with HCl for absorption into the exposed thin surface layer.

16. The method of claim 14, wherein the removing step comprises applying energy to react the absorbed species in the exposed thin surface layer and remove the exposed thin surface layer from the high-k gate dielectric layer.

17. The method of claim 14, wherein the preparing and removing steps remove a monolayer of material from the high-k gate dielectric layer, and wherein the preparing and removing steps are repeated until a desired thickness of the high-k gate dielectric layer remains.

* * * * *